US012593567B2

(12) United States Patent
Lee et al.

(10) Patent No.: US 12,593,567 B2
(45) Date of Patent: Mar. 31, 2026

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: Chihak Lee, Seoul (KR); Sangkyoung Moon, Incheon (KR)

(73) Assignee: LG Display Co., Ltd., Seoul (KR)

( * ) Notice: Subject to any disclaimer, the term of this patent is extended or adjusted under 35 U.S.C. 154(b) by 610 days.

(21) Appl. No.: 17/994,622

(22) Filed: Nov. 28, 2022

(65) Prior Publication Data

US 2023/0217726 A1 Jul. 6, 2023

(30) Foreign Application Priority Data

Dec. 31, 2021 (KR) ......................... 10-2021-0194334

(51) Int. Cl.
| | |
|---|---|
| *H10K 59/12* | (2023.01) |
| *H10K 50/13* | (2023.01) |
| *H10K 50/19* | (2023.01) |
| *H10K 59/122* | (2023.01) |
| *H10K 59/35* | (2023.01) |
| *H10K 71/16* | (2023.01) |

(52) U.S. Cl.
CPC ........... *H10K 59/122* (2023.02); *H10K 50/13* (2023.02); *H10K 50/19* (2023.02); *H10K 59/353* (2023.02); *H10K 71/166* (2023.02)

(58) Field of Classification Search
CPC ...... H10K 59/122; H10K 50/13; H10K 50/19; H10K 59/353; H10K 71/166; H10K 59/32; H10K 59/771; H10K 59/35; C23C 14/042
See application file for complete search history.

(56) References Cited

U.S. PATENT DOCUMENTS 10,784,320 B2 9/2020 Park et al.
2007/0046185 A1* 3/2007 Kim ..................... H10K 59/352
313/504

(Continued)

FOREIGN PATENT DOCUMENTS

| EP | 3343627 A1 | 7/2018 |
|---|---|---|
| KR | 10-2018-0079037 A | 7/2018 |
| KR | 10-2019-0064051 A | 6/2019 |

OTHER PUBLICATIONS

European Patent Office, Extended European Search Report, European Patent Application No. 22203825.9, May 12, 2023, eight pages.

*Primary Examiner* — S M Sohel Imtiaz
(74) *Attorney, Agent, or Firm* — Fenwick & West LLP

(57) ABSTRACT

An organic light emitting display device is disclosed that includes a substrate on which a first sub pixel configured to emit a first color, a second sub pixel configured to emit a second color, and a third sub pixel configured to emit a third color are disposed, a first electrode that defines emitting areas of the first sub pixel, the second sub pixel, and the third sub pixel and is disposed on the substrate, an organic light emitting diode on the first electrode, a bank that defines the emitting areas of the first sub pixel, the second sub pixel, and the third sub pixel and is disposed in a non-emitting area and exposes an upper portion of the first electrode and a second electrode on the organic light emitting diode. The organic light emitting diode includes a path blocking layer in the non-emitting area.

10 Claims, 13 Drawing Sheets

(56)  References Cited

U.S. PATENT DOCUMENTS

| | | | |
|---|---|---|---|
| 2011/0232749 A1* | 9/2011 | Lienhart | ................ H10F 19/30 |
| | | | 204/192.12 |
| 2015/0090985 A1* | 4/2015 | Park | .................... H10K 59/351 |
| | | | 257/40 |
| 2017/0194385 A1* | 7/2017 | Jung | ...................... H10K 59/30 |
| 2017/0287988 A1* | 10/2017 | Lee | ........................ H10K 50/19 |
| 2018/0190738 A1* | 7/2018 | Park | .................... H10K 59/173 |
| 2020/0194522 A1* | 6/2020 | Lee | ........................ H10K 71/12 |
| 2021/0126215 A1 | 4/2021 | Park et al. | |
| 2021/0151709 A1* | 5/2021 | Yoneda | ........... H10K 59/80516 |
| 2021/0202877 A1* | 7/2021 | Mishima | ......... H10K 59/80524 |

* cited by examiner

NEA

ORGANIC LIGHT EMITTING DISPLAY DEVICE AND METHOD FOR MANUFACTURING THE SAME

CROSS-REFERENCE TO RELATED APPLICATION

This application claims the priority of Republic of Korea Patent Application No. 10-2021-0194334 filed on Dec. 31, 2021, in the Korean Intellectual Property Office, which is hereby incorporated by reference in its entirety.

BACKGROUND

Field

The present disclosure relates to an organic light emitting display device and a manufacturing method thereof, and more particularly, to an organic light emitting display device having a tandem structure which suppresses abnormal emission due to a leakage current and a manufacturing method thereof.

Description of the Related Art

The organic light emitting display device (OLED) is a self-emitting display device and uses an organic light emitting diode in which electrons and holes from a cathode for injecting electrons and an anode for injecting holes are injected into an emission material layer and excitons formed by coupling the injected electrons and holes are dropped from an excited state to a ground state to emit light.

Such an organic light emitting display device does not need a separate light source, which is different from a liquid crystal display device (LCD). Therefore, the organic light emitting display device may be manufactured to be light weight and thin. Further, since the organic light emitting display device is driven at a low voltage, it is advantageous not only in terms of power consumption, but also in terms of a color implementation, a response speed, a viewing angle, and a contrast ratio (CR). Therefore, the organic light emitting display device is being studied as next generation displays.

As the display is developed to a high resolution, the number of pixels in a unit area are increased and a high luminance is demanded. However, there is a limitation in a unit area current (A) due to the emission structure of the organic light emitting display device and there are problems in that the reliability of the organic light emitting diode is degraded and the power consumption is increased due to the increase of the applied current.

Accordingly, it is necessary to overcome the technical limitations of improving a luminous efficiency and a lifespan of an organic light emitting diode and reducing power consumption which are factors that impede the quality and the productivity of the organic light emitting display device. Further, various studies are being conducted to develop an organic light emitting diode which improves the luminous efficiency, the lifespan of the organic emission material layer, and a viewing angle characteristic while maintain a color gamut.

SUMMARY

An object to be achieved by the present disclosure is to provide an organic light emitting display device which blocks a path through which a leakage current causing the emission of an unintended adjacent sub pixel flows at a low gray scale level and a manufacturing method thereof.

Objects of the present disclosure are not limited to the above-mentioned objects, and other objects, which are not mentioned above, can be clearly understood by those skilled in the art from the following descriptions.

According to an aspect of the present disclosure, there is provided an organic light emitting display device. The organic light emitting display device includes a substrate in which a first sub pixel emitting a first color, a second sub pixel emitting a second color, and a third sub pixel emitting a third color are disposed, a first electrode which defines emitting areas of the first sub pixel, the second sub pixel, and the third sub pixel and is disposed in the emitting area on the substrate, an organic light emitting diode on the first electrode, a bank which defines emitting areas of the first sub pixel, the second sub pixel, and the third sub pixel and is disposed in the non-emitting area to expose an upper portion of the first electrode and a second electrode on the organic light emitting diode. The organic light emitting diode includes a path blocking layer disposed in the non-emitting area.

According to another aspect of the present disclosure, there is provided a manufacturing method of an organic light emitting display device. The manufacturing method of an organic light emitting display device includes forming a first electrode on a substrate on which a circuit element layer is formed, forming a bank on the first electrode to cover ends of the first electrode, forming a first emission unit by depositing a first organic light emitting material along the first electrode and an upper surface of the bank, depositing an organic material only above the bank to form a path blocking layer, depositing an n-type charge generation material above the first emission unit and the path blocking layer, detaching the n-type charge generation material deposited above the path blocking layer to form a first charge generation layer, depositing a p-type charge generating material above the first charge generation layer and the path blocking layer to form a second charge generation layer and forming a second emission unit by depositing a second organic light emitting material above the second charge generation layer.

Other detailed matters of the exemplary embodiments are included in the detailed description and the drawings.

According to the present disclosure, a path blocking layer formed of an organic material is formed in a non-emitting area at the same level as a first charge generation layer of an emitting area to block a horizontal leakage current flowing path due to a metal material included in the first charge generation layer. By doing this, abnormal emission that an unexpected sub pixel emits light is blocked to improve a display quality of the organic light emitting display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

3

Figure 1:
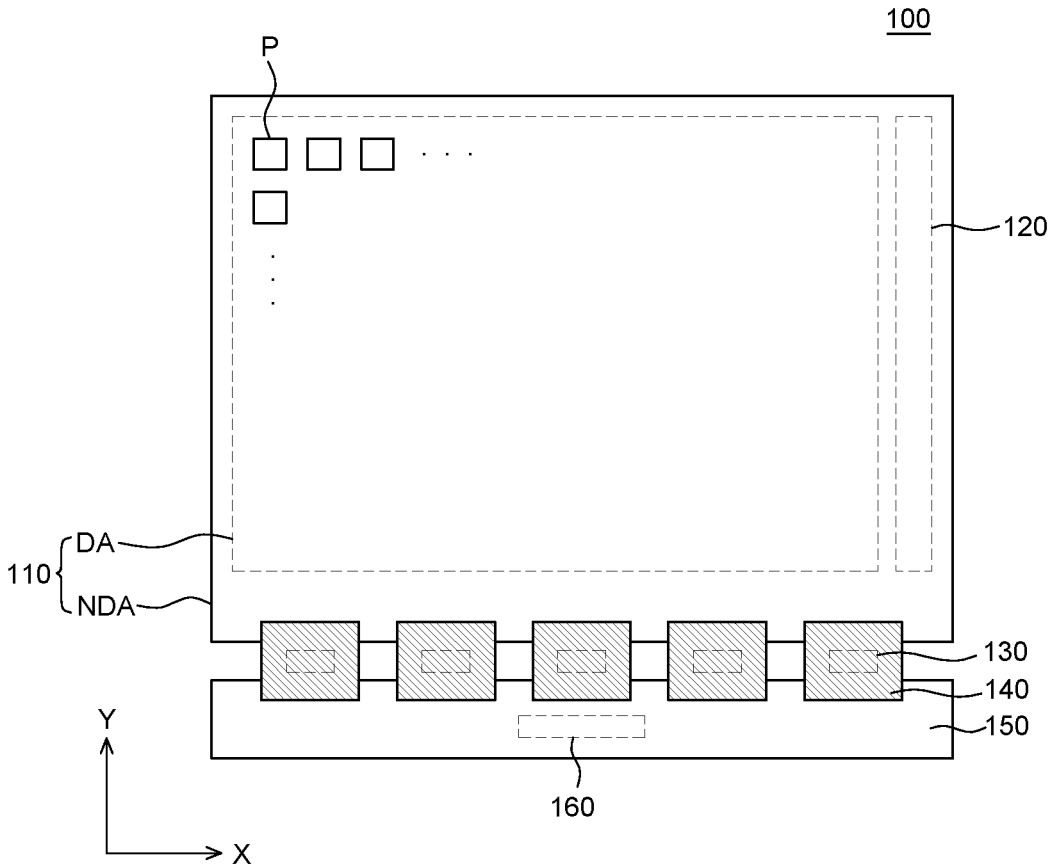
FIG. 1 is a plan view of an organic light emitting display device according to an exemplary embodiment of the present disclosure.
Figure 2:
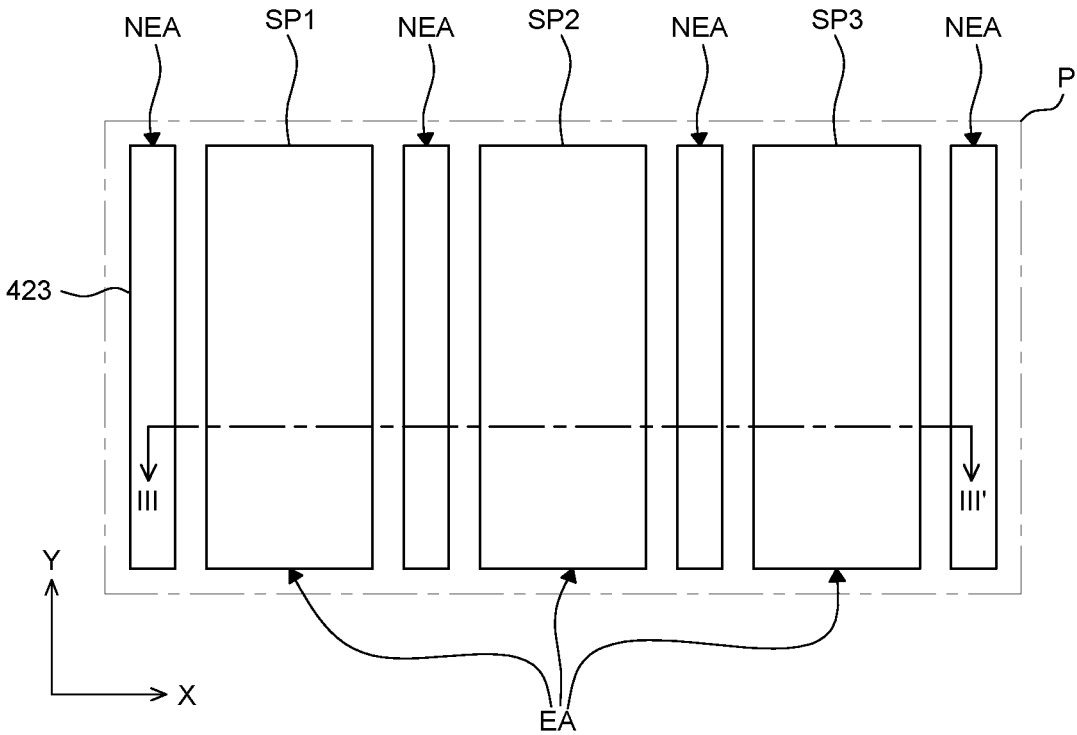
FIG. 2 is a plan view illustrating an example of a pixel of FIG. 1 according to an exemplary embodiment of the present disclosure.
Figure 3:
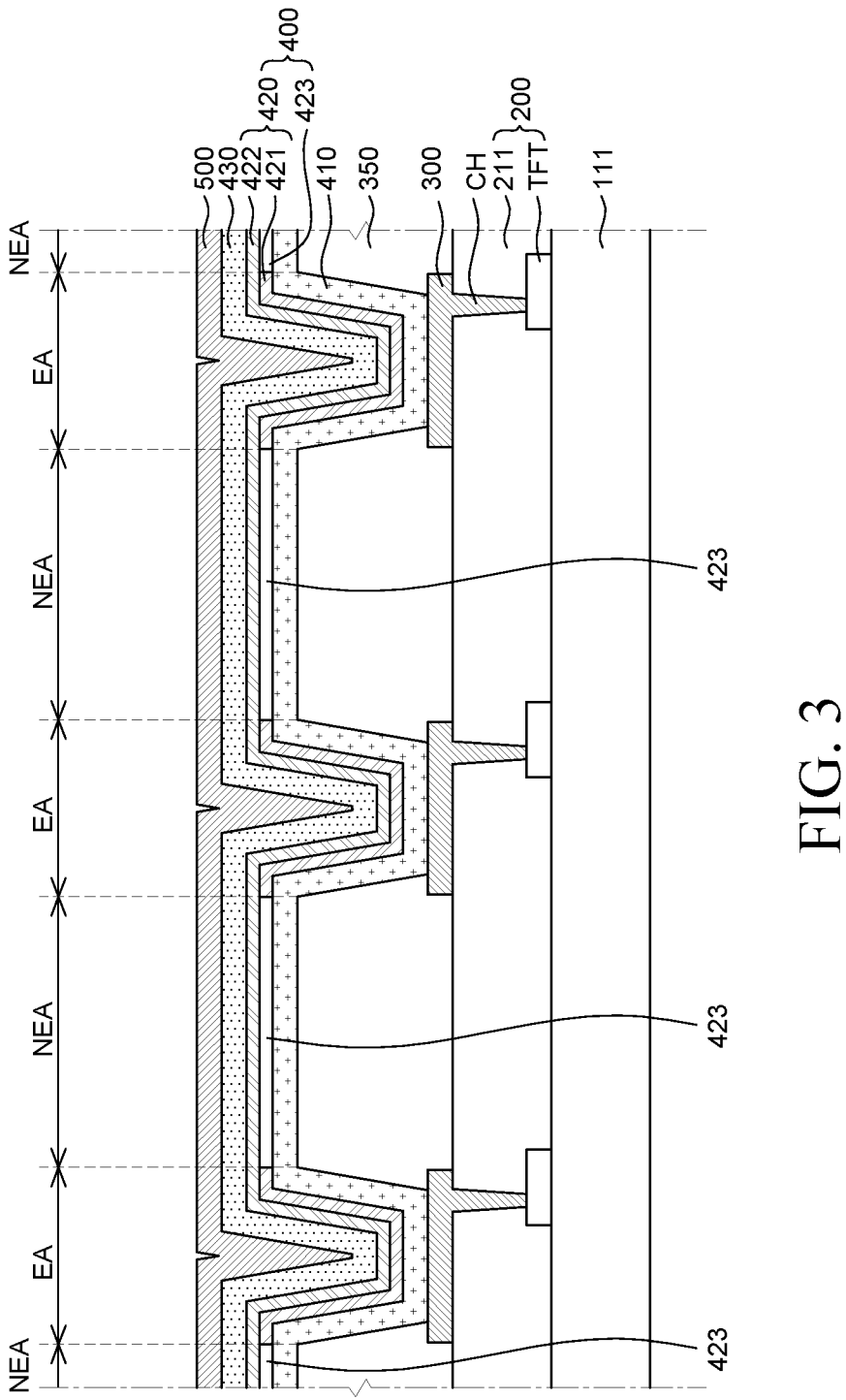
Figure 4:
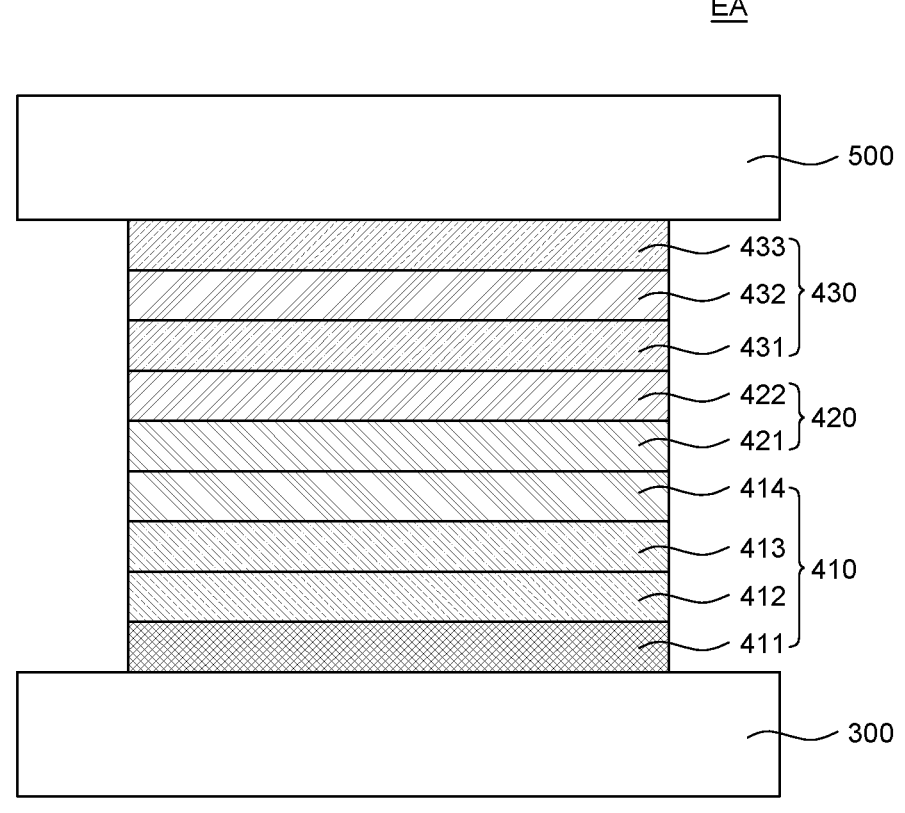
Figure 5:
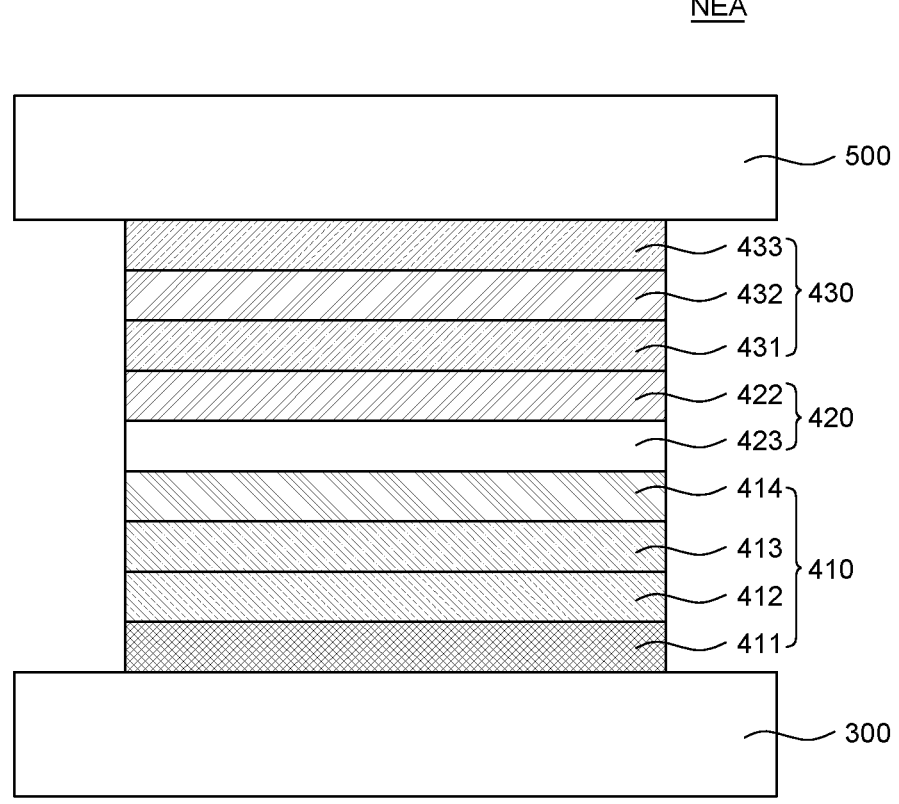
Figure 7:
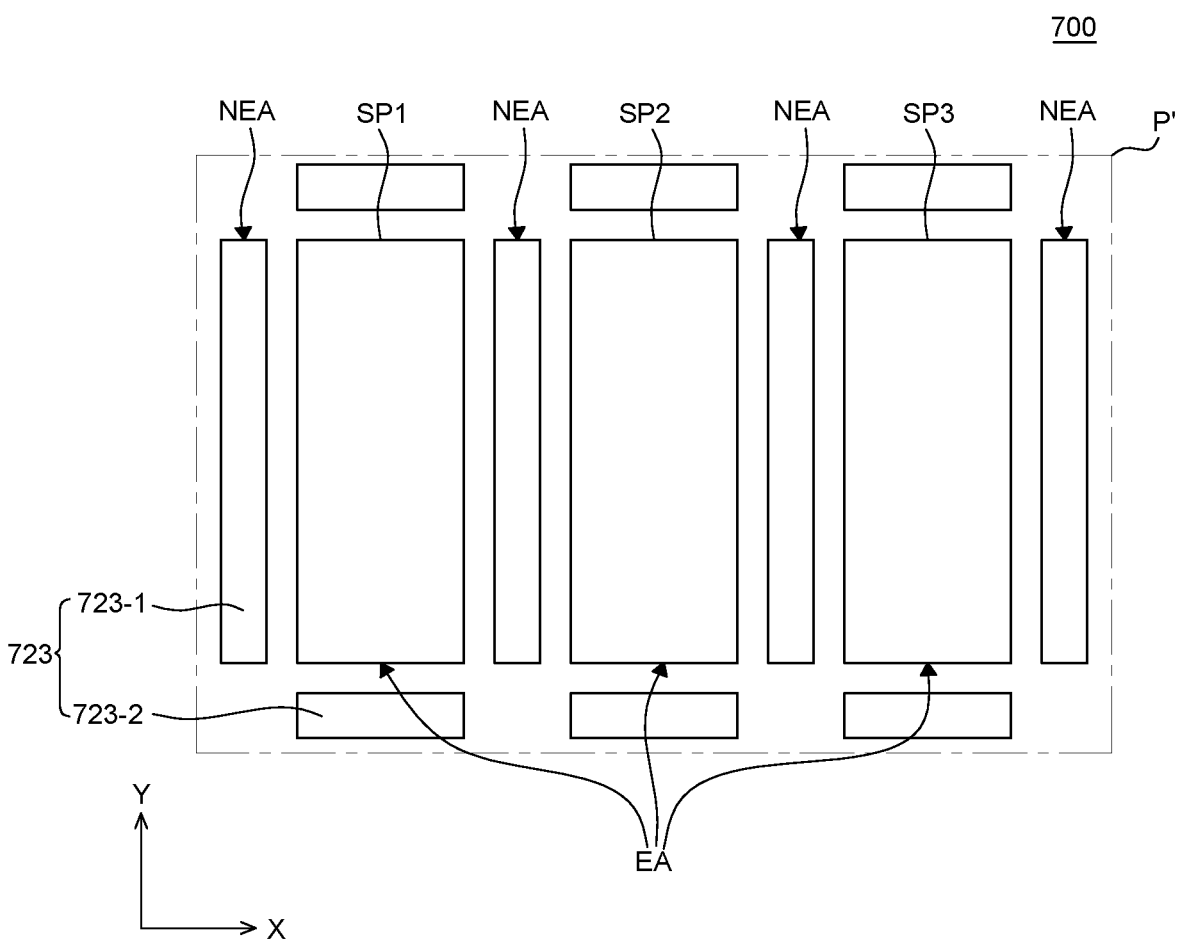
Figure 8:
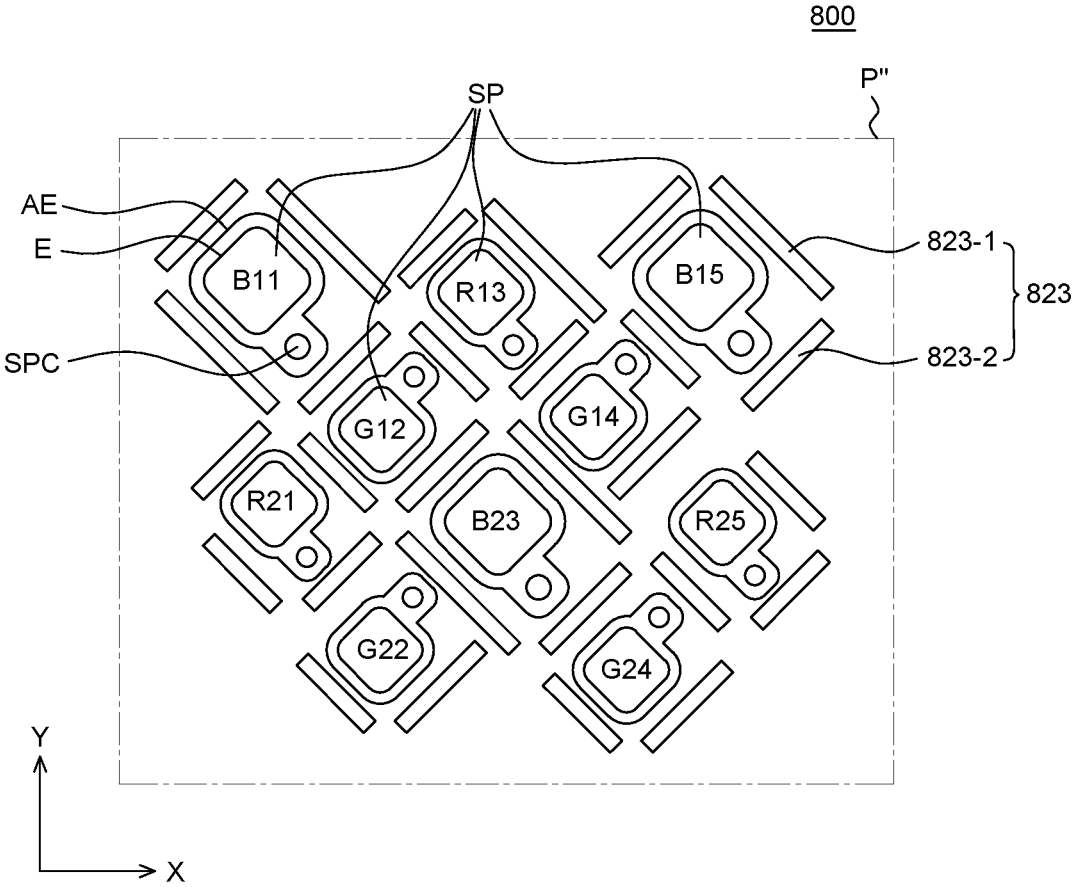

FIG. 3 is a cross-sectional view taken along the line of FIG. 2 according to an exemplary embodiment of the present disclosure;

FIG. 4 is a view schematically illustrating an emitting area of a pixel according to an exemplary embodiment of the present disclosure;

FIG. 5 is a view schematically illustrating a non-emitting area of a pixel according to an exemplary embodiment of the present disclosure;

FIGS. 6A to 6F are views illustrating a manufacturing method of an organic emission material layer according to an exemplary embodiment of the present disclosure;

FIG. 7 is a plan view illustrating another example of a pixel of FIG. 1 according to an exemplary embodiment of the present disclosure; and FIG. 8 is a plan view illustrating still another example of a pixel of FIG. 1 according to an exemplary embodiment of the present disclosure.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a plan view of an organic light emitting display device according to an exemplary embodiment of the present disclosure. Referring to FIG. 1, an organic light emitting display device 100 according to an exemplary embodiment of the present disclosure includes a display panel 110, a gate driver 120, a data driver 130, a flexible film 140, a circuit board 150, and a timing controller 160.

The display panel 110 includes a first substrate and a second substrate. The first substrate may be a plastic film or a glass substrate and gate lines, data lines, and a plurality of pixels P are disposed thereon. The second substrate is located to be opposite to the first substrate and may be a plastic film, a glass substrate, or an encapsulation substrate.

The display panel 110 may be divided into a display area DA in which images are displayed and a non-display area NDA in which images are not displayed. In the display area DA, gate lines, data lines, and pixels may be disposed and in the non-display area NDA, the gate driver 120 and pads may be disposed.

Each of pixels P may include a thin film transistor and an organic light emitting diode including a first electrode, an organic emission material layer, and a second electrode. Here, the organic emission material layer is a tandem organic emission material layer in which a first emission unit and a second emission unit are sequentially laminated. When a gate signal is input from the gate line, each pixel supplies a predetermined current to the organic light emitting diode according to a data voltage of the data line, using the thin film transistor. By doing this, the organic light emitting diode of each pixel may emit light with a predetermined brightness according to the predetermined current. The structure of each pixel will be described in more detail with reference to FIGS. 2 to 5.

The gate driver 120 supplies a gate signal to the gate lines according to a gate control signal input from the timing controller 160. The gate driver 120 may be disposed in a gate in panel (GIP) manner in a non-display area NDA at one or both outsides of the display area DA of the display panel 110. Alternatively, the gate driver 120 may be manufactured as a driving chip to be mounted in a flexible film or attached at non-display area NDA at one or both outsides of the display area DA of the display panel 110 in a tape automated bonding (TAB) manner.

The data driver 130 receives digital video data and a source control signal from the timing controller 160. The data driver 130 converts digital video data into analog data voltages according to a source control signal to supply the analog data voltages to the data lines.

In the non-display area NDA of the display panel 110, pads such as data pads may be formed. In the flexible film 140, wiring lines which connect the pads and the data driver 130 and wiring lines which connect the pads and wiring lines of the circuit board 150 may be disposed. The flexible film 140 is attached onto the pads using an anisotropic conducting film to connect the pads and the wiring lines of the flexible film 140.

The circuit board 150 may be attached to the flexible films 140. In the circuit board 150, a plurality of circuits which are implemented by driving chips may be mounted. For example, the timing controller 160 may be mounted on the circuit board 150. The circuit board 150 may be a printed circuit board or a flexible printed circuit board.

The timing controller 160 receives digital video data and a timing signal from an external system board by means of a cable of the circuit board 150. The timing controller 160 generates a gate control signal for controlling an operation timing of the gate driver 120 and a source control signal for controlling the data driver 130 based on the timing signal. The timing controller 160 supplies a gate control signal to the gate driver 120 and supplies a source control signal to the data driver 130.

Next, the structure of pixels disposed in the display area DA of the organic light emitting display device 100 according to the exemplary embodiment of the present disclosure will be described in more detail with reference to FIGS. 2 to 5.

FIG. 2 is a plan view illustrating an example of a pixel of FIG. 1 according to an exemplary embodiment of the present disclosure. FIG. 3 is a cross-sectional view taken along the line of FIG. 2 according to an exemplary embodiment of the present disclosure. FIG. 4 is a view schematically illustrating an emitting area of a pixel according to an exemplary embodiment of the present disclosure. FIG. 5 is a view schematically illustrating a non-emitting area of a pixel according to an exemplary embodiment of the present disclosure. Referring to FIGS. 2 to 5, each of pixels P disposed in the display area DA of the organic light emitting display device 100 according to the exemplary embodiment of the present disclosure include a first sub pixel SP1, a second sub pixel SP2, and a third sub pixel SP3.

The first sub pixel SP1 is a red sub pixel which emits red light which is first color of light, the second sub pixel SP2 is a green sub pixel which emits green light which is second color of light, and the third sub pixel SP3 is a blue sub pixel which emits blue light which is third color of light. Here, in the exemplary embodiment of the present disclosure, it is described that each pixel includes three sub pixels, but is not limited thereto. For example, each pixel may include four sub pixels and further include red, green, and blue sub pixels, and a white sub pixel.

Each sub pixel SP1, SP2, or SP3 includes an emitting area EA and a non-emitting area NEA.

The emitting area EA is an area in which an organic light emitting diode is disposed to emit light and is defined by the first electrode or an organic light emitting diode disposed in the emitting area EA.

The non-emitting area NEA is an area excluding the emitting area EA from the pixel P. The light emitting diode is not disposed in the non-emitting area so that light is not emitted. In other words, the non-emitting area NEA may be an area enclosing the emitting area EA and may be an area in which a bank defining the area of each sub pixel SP1, SP2, or SP3 is disposed. Further, in the non-emitting area NEA, a path blocking layer 423 which suppress the unexpected emission generated in the adjacent pixel due to the leakage current may be formed.

As illustrated in FIG. 2, the path blocking layer 423 may be formed in a stripe pattern in a vertical direction, that is, a Y-axis direction between sub pixels SP1, SP2, and SP3 disposed in a horizontal direction, that is, an X-axis direction. Namely, the vertical direction is a first direction that is perpendicular to the (second) horizontal direction. The path blocking layer 423 is formed of an organic material to be patterned, for example, may be formed of an organic material including carbon dioxide, diphenyldifluororsilane, anthracene, pyrene, and perfluoroethene. Further, the path blocking layer 423 is formed using a fine metal mask (FMM). Accordingly, in the organic light emitting display device 100 according to the exemplary embodiment of the present disclosure, the path blocking layer 423 is formed on the bank which defines each sub pixel SP1, SP2, or SP3. Therefore, the leakage current flowing path in the horizontal direction is blocked to reduce abnormal emission of an unexpected adjacent sub pixel.

Each of the first to third sub pixels SP1, SP2, and SP3 includes a circuit element layer 200, a first electrode 300, an emission material layer 400, and a second electrode 500 on the first substrate 111, as illustrated in FIG. 3.

The first substrate 111 may be formed of glass or plastic, but is not necessarily limited thereto and may be formed of a semiconductor material such as a silicon wafer. The first substrate 111 may be formed of a transparent material or an opaque material. The organic light emitting display device 100 according to the exemplary embodiment of the present disclosure may be formed as a top emission type in which emitted light is discharged to the upper portion, but is not necessarily limited thereto. If the organic light emitting display device 100 according to the exemplary embodiment of the present disclosure is formed as a top emission type in which emitted light is discharged toward the upper portion, the first substrate 111 may use not only the transparent material, but also an opaque material. In contrast, if the organic light emitting display device 100 according to the exemplary embodiment of the present disclosure is formed as a bottom emission type in which emitted light is discharged toward the lower portion, the first substrate 111 may use the transparent material.

The circuit element layer 200 is formed on the first substrate 111. In the circuit element layer 200, a circuit element including various signal lines, a thin film transistor, and a capacitor may be provided for every sub pixel SP1, SP2, or SP3. The signal lines may include a gate line, a data line, a power line, and a reference line and the thin film transistor may include a switching thin film transistor, a driving thin film transistor TFT, and a sensing thin film transistor.

The switching thin film transistor switches according to the gate signal supplied to the gate line to supply the data voltage supplied from the data line to the driving thin film transistor TFT.

The driving thin film transistor TFT switches according to the data voltage supplied from the switching thin film transistor to generate a data current from a power supplied from the power line to supply the data current to the first electrode 300.

The sensing thin film transistor serves to sense a threshold voltage deviation of the driving thin film transistor TFT which is a cause of the image quality degradation to supply the current of the driving thin film transistor TFT to the reference line in response to a sensing control signal supplied from the gate line or a separate sensing line.

The capacitor serves to maintain a data voltage supplied to the driving thin film transistor TFT for one frame and is connected to a gate terminal and a source terminal of the driving thin film transistor TFT.

On the circuit element layer 200, an insulating layer 211 may be formed between the thin film transistor and the first electrode 300. To be more specific, the insulating layer 211 may be a protective layer for protecting the thin film transistor TFT or a planarization layer for planarizing a step due to the thin film transistor TFT.

In such a circuit element layer 200, a contact hole CH which passes through the insulating layer 211 for every sub pixel SP1, SP2, or SP3 is provided to electrically connect a source terminal or a drain terminal of the driving thin film transistor TFT and the first electrode 300 through the contact hole CH.

The first electrode 300 is formed on the circuit element layer 200 to be patterned for every sub pixel SP1, SP2, or SP3. The first electrode 300 is connected to the source terminal or the drain terminal of the driving thin film transistor TFT through the contact hole CH. Therefore, the first electrode 300 is applied with a high potential voltage from the source terminal or the drain terminal of the driving thin film transistor TFT through the contact hole CH.

The first electrode 300 may define the emitting area EA of each of the first to third sub pixels SP1, SP2, and SP3. That is, in each sub pixel SP1, SP2, or SP3, an area in which the first electrode 300 is formed may be an emitting area EA. In contrast, in each sub pixel SP1, SP2, or SP3, an area in which the first electrode 300 is not formed may be a non-emitting area NEA.

The first electrode 300 may be formed of a transparent metal material, a semi-transmissive metal material, or a metal material having a high reflectance. When the organic light emitting display device 100 is formed as a top emission type, the first electrode 300 may be formed of a metal material having a high reflectance such as a lamination structure Ti/Al/Ti of aluminum and titanium, a lamination structure ITO/AL/ITO of aluminum and ITO, an Ag alloy, and a lamination structure of Ag alloy and ITO (ITO/Ag alloy/ITO). The Ag alloy may be an alloy of silver (Ag), palladium (Pd), and copper (Cu). In the meantime, when the organic light emitting display device 100 is formed as a bottom emission type, the first electrode 300 may be formed of a transparent metal material (TCO, transparent conductive material) which transmits light, such as ITO or IZO or a semi-transmissive conductive material such as magnesium (Mg), silver (Ag), or an alloy of magnesium (Mg) and silver (Ag). Such a first electrode 300 may be an anode electrode.

The bank 350 may be formed on the circuit element layer 200 so as to cover each end of the first electrode 300. That is, the bank 350 may be located between sub pixels SP1, SP2, and SP3 and thus, the bank 350 may define each sub pixel (SP1, SP2, SP3) area or an emitting area EA. The bank 350 may be formed of an inorganic insulating layer and/or an organic insulating layer. In the bank 350, a contact hole is formed to expose an upper surface of the first electrode 300 of each sub pixel SP1, SP2, or SP3.

The organic emission material layer 400 is disposed on the first electrode 300 and the bank 350. As illustrated in FIGS. 4 and 5, the organic emission material layer 400 may include a first emission unit 410, a charge generation unit 420, and a second emission unit 430. To be more specific, the organic emission material layer 400 may have a two-stack structure configured by sequentially laminating the first emission unit 410 and the second emission unit 430.

The first emission unit 410 is located between the first electrode 300 and the charge generation unit 420 and includes a hole injection layer (HIL) 411, a first hole transporting layer (HTL) 412, a first emission material layer (EML) 413, and a first electron transporting layer (ETL) 414. To be more specific, the first emission unit 410 may be configured by sequentially laminating the hole injection layer 411, the first hole transporting layer 412, the first emission material layer 413, and the first electron transporting layer 414.

The charge generation unit 420 is located between the first emission unit 410 and the second emission unit 420 and controls a charge balance between the first emission unit 410 and the second emission unit 430.

The charge generation unit 420 may include a first charge generation layer 421, a second charge generation layer 422, and a path blocking layer 423. The charge generation unit 420 may have different lamination structures in the emitting area EA and the non-emitting area NEA. To be more specific, in the emitting area EA, the first charge generation layer 421 adjacent to the first emission unit 410 and the second charge generation layer 422 adjacent to the second emission unit 430 are laminated. In the non-emitting area NEA, the path blocking layer 423 adjacent to the first emission unit 410 and the second charge generation layer 422 adjacent to the second emission unit 430 are laminated.

The first charge generation layer 421 serves as an n-type charge generation layer n-CGL which helps injection of the electrons into the first emission unit 410 located below the first charge generation layer 421 and is located between the first emission unit 410 and the second charge generation layer 422 in the emitting area EA. The first charge generation layer 421 may be formed of an alkali metal, an alkali metal compound, or an organic material or a compound thereof which serves to inject electrons. Further, a host material of the first charge generation layer 421 may be formed of the same material as the material of the first electron transporting layer 414. For example, the host material may be formed of a mixed layer in which an organic material such as anthracene derivative is doped with a dopant such as lithium, but it is not limited thereto.

The second charge generation layer 422 serves as a p-type charge generation layer p-CGL which helps the holes to be injected into the second emission unit 430 located above the second charge generation layer 422. In the emitting area EA, the second charge generation layer 422 is located between the first charge generation layer 421 and the second emission unit 430 and in the non-emitting area NEA, is located between the path blocking layer 423 and the second emission unit 430. The host material of the second charge generation layer 422 may be formed of the same material as the material of the hole injection layer 411 and the first hole transporting layer 412. For example, the host material of the second charge generation layer may be formed of a mixed layer in which an organic material such as 1, 4, 5, 8, 9, 11-hexaazatriphenylene-hexanitrile (HATCN), copper phthalocyanine (CuPc), and tris(4-bromophenyl)aluminum hexacholroantimonate (TBAHA) is doped with a p type dopant, but is not limited thereto. Further, the p-type dopant is formed of any one of F4-TCNQ or NDP-9, but is not limited thereto.

The path blocking layer 423 serves to block a leakage current path due to the metal material included in the first charge generation layer 421 formed in the emitting area EA and may be located only on the bank 350 using a fine metal mask (FMM) in the non-emitting area NEA. To be more specific, the path blocking layer 423 is located between the first electron transporting layer 414 of the first emission unit 410 and the second charge generation layer 422, formed on the bank 350. That is, the path blocking layer 423 may be located at the same level as the first charge generation layer 421. Therefore, in the emitting area EA, the first charge generation layer 421 is located between the first electron transporting layer 414 and the second charge generation layer 422. Further, in the non-emitting area NEA, the path blocking layer 423 is located between the first electron transporting layer 414 and the second charge generation layer 422. The path blocking layer 423 is formed of an organic material, for example, may be formed of an organic material including carbon dioxide, diphenyldifluororsilane, anthracene, pyrene, perfluoroethene, and the like.

The second emission unit 430 is located between the charge generation unit 420 and the second electrode 500 in the emitting area EA and includes the second hole transporting layer (HTL) 431, the second emission material layer EML 432, and the second electron transporting layer (ETL) 433. To be more specific, the second emission unit 430 may be configured by sequentially laminating the second hole transporting layer 431, the second emission material layer 432, and the second electron transporting layer 433.

The second electrode 500 may be located on the second emission unit 430. The second electrode 500 may be formed of a transparent metal material, a semi-transmissive metal material, or a metal material having a high reflectance. When the organic light emitting display device 100 according to an exemplary embodiment of the present disclosure is formed as a top emission type, the second electrode 500 may be formed of a transparent metal material (TCO, transparent conductive material) which transmits light, such as ITO or IZO or a semi-transmissive conductive material such as magnesium (Mg), silver (Ag), or an alloy of magnesium (Mg) and silver (Ag). When the organic light emitting display device 100 is formed as a bottom emission type, the second electrode 500 may be formed of a metal material having a high reflectance such as a lamination structure Ti/Al/Ti of aluminum and titanium, a lamination structure ITO/AL/ITO of aluminum and ITO, an Ag alloy, and a lamination structure of Ag alloy and ITO (ITO/Ag alloy/ITO). Such a second electrode 500 may be a cathode electrode.

A forming process of an organic emission material layer 400 of an organic light emitting display device 100 according to an exemplary embodiment of the present disclosure will be described in more detail with reference to FIGS. 6A to 6G.

FIGS. 6A to 6F are views illustrating a manufacturing method of an organic emission material layer according to an exemplary embodiment of the present disclosure.

Figure 6A:
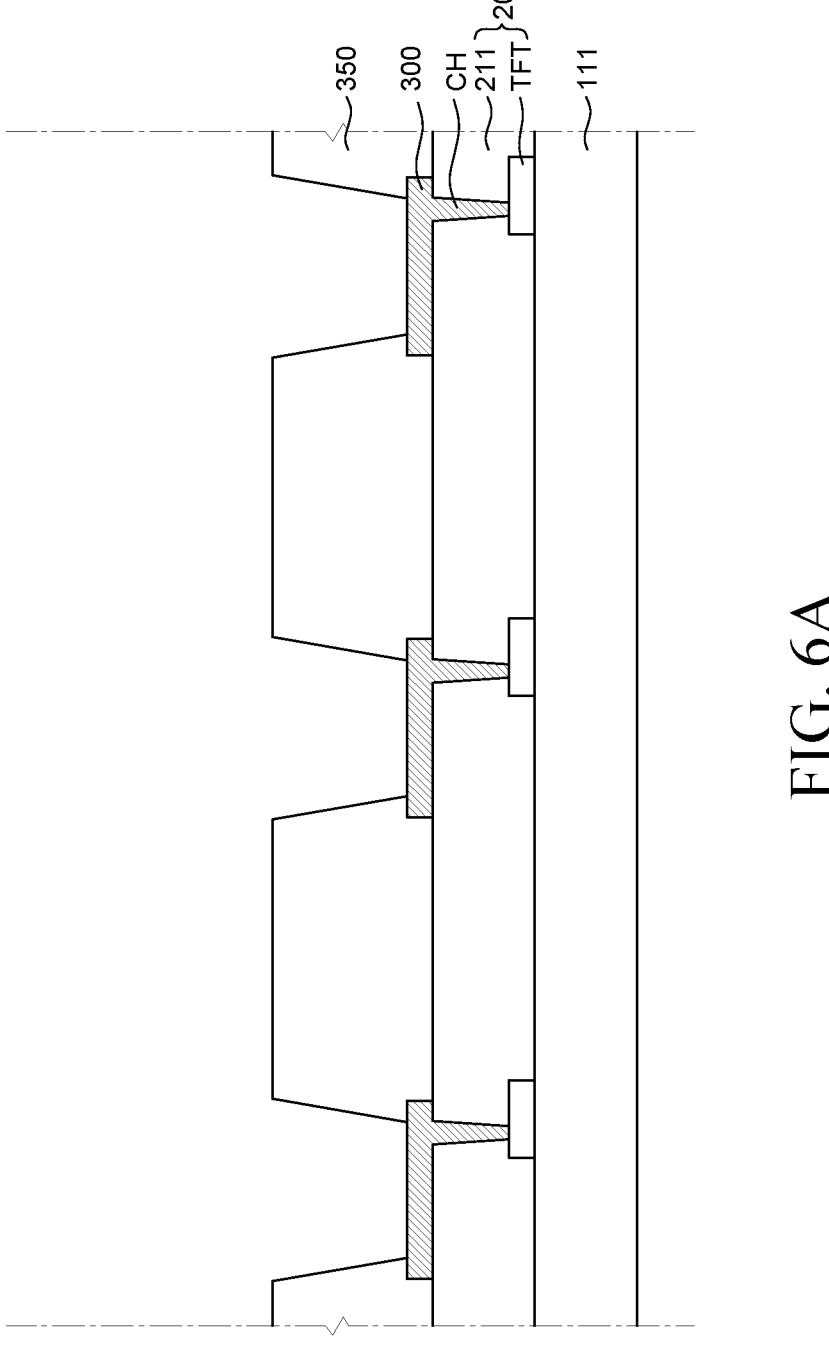

First, referring to FIG. 6A, a first electrode 300 and a bank 350 for defining each sub pixel SP1, SP2, or SP3 or the emitting area EA are formed on the first substrate 111 on which the circuit element layer 200 is formed. At this time, the first electrode 300 may be formed of a metal material having a high reflectance such as a lamination structure (Ti/Al/Ti) of aluminum and titanium, a lamination structure (ITO/Al/ITO) of aluminum and ITO, an APC alloy, and a lamination structure (ITO/APC/ITO) of an APC alloy and ITO. The first electrode may be formed by a physical vapor deposition method such as sputtering. In the meantime, the bank 350 may be formed of an organic material and/or an inorganic material and is formed by depositing the inorganic material and/or the organic material after forming the first electrode 300 and etching the inorganic material and/or the organic material so as to expose an upper surface of the first electrode 300.

Figure 6B:
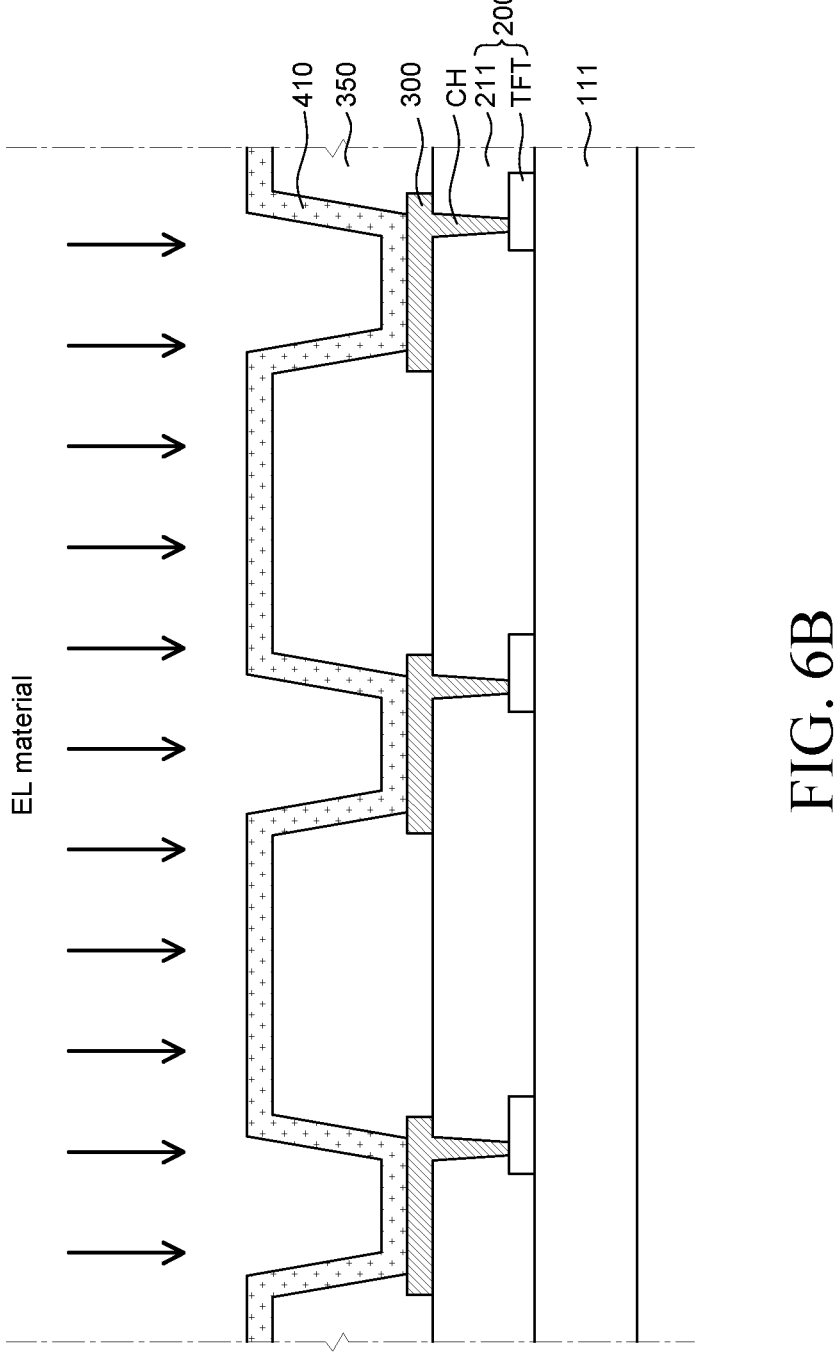

Next, as illustrated in FIG. 6B, the first organic light emitting material (EL material) is deposited in accordance with a shape of the first electrode 300 and the bank 350 on the first substrate 111 to form the first emission unit 410 of the organic emission material layer 400. Here, the first organic light emitting material may be deposited using an open metal mask (OMM) in which the opening is formed in the entire display area.

Figure 6C:
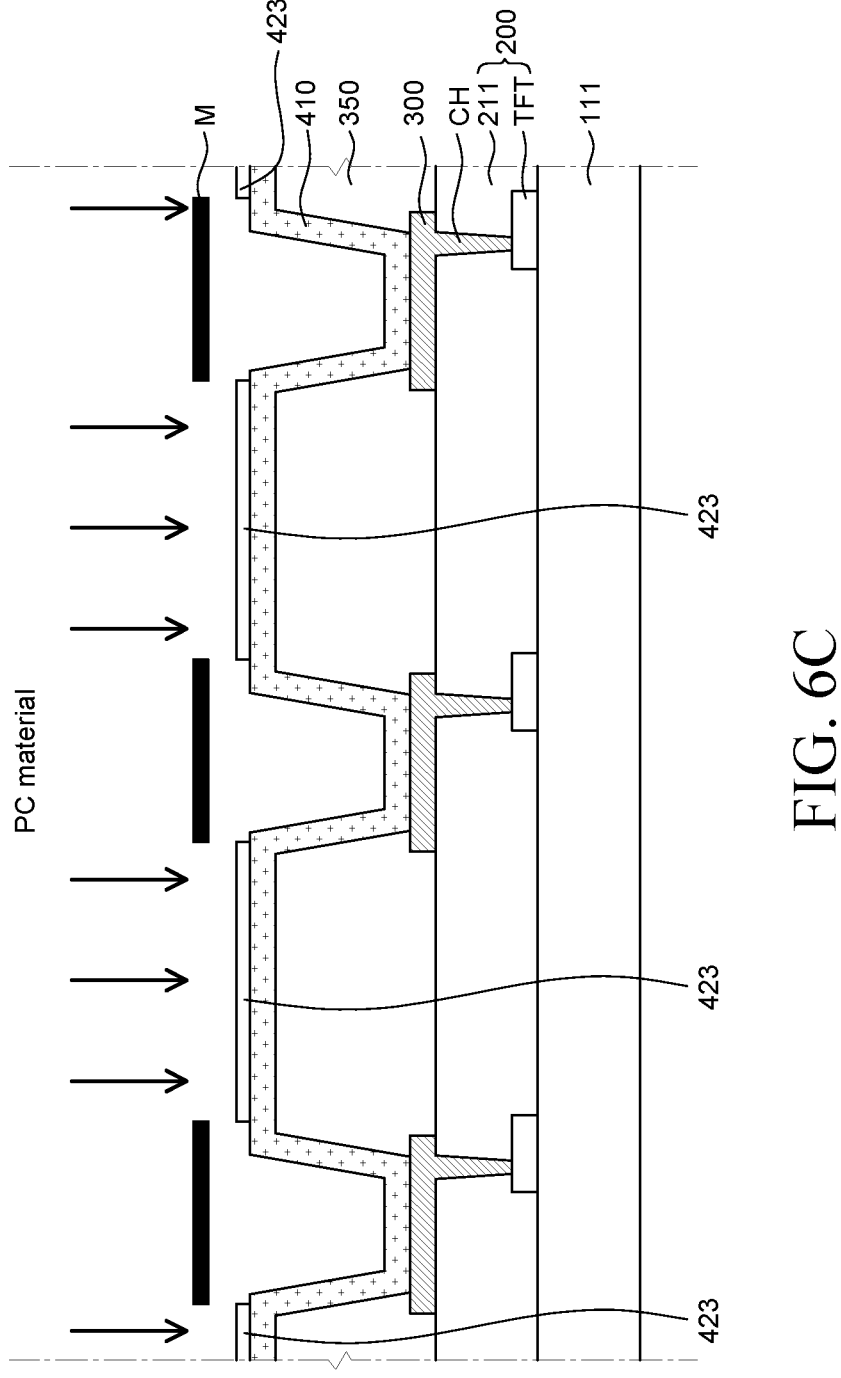

Next, as illustrated in FIG. 6C, a path blocking material (PC material) is deposited on the first substrate 111 on which the first emission unit 410 is formed to form the path blocking layer 423 on the first emission unit 410 on the bank 350. At this time, the path blocking material may be deposited only in the non-emitting area NEA which is an area on the bank 350, using the fine metal mask M. The path blocking material may be formed of an organic material including carbon dioxide, Diphenyldifluorosilane, Anthracene, Pyrene, and Perfluoroethene.

Figure 6D:
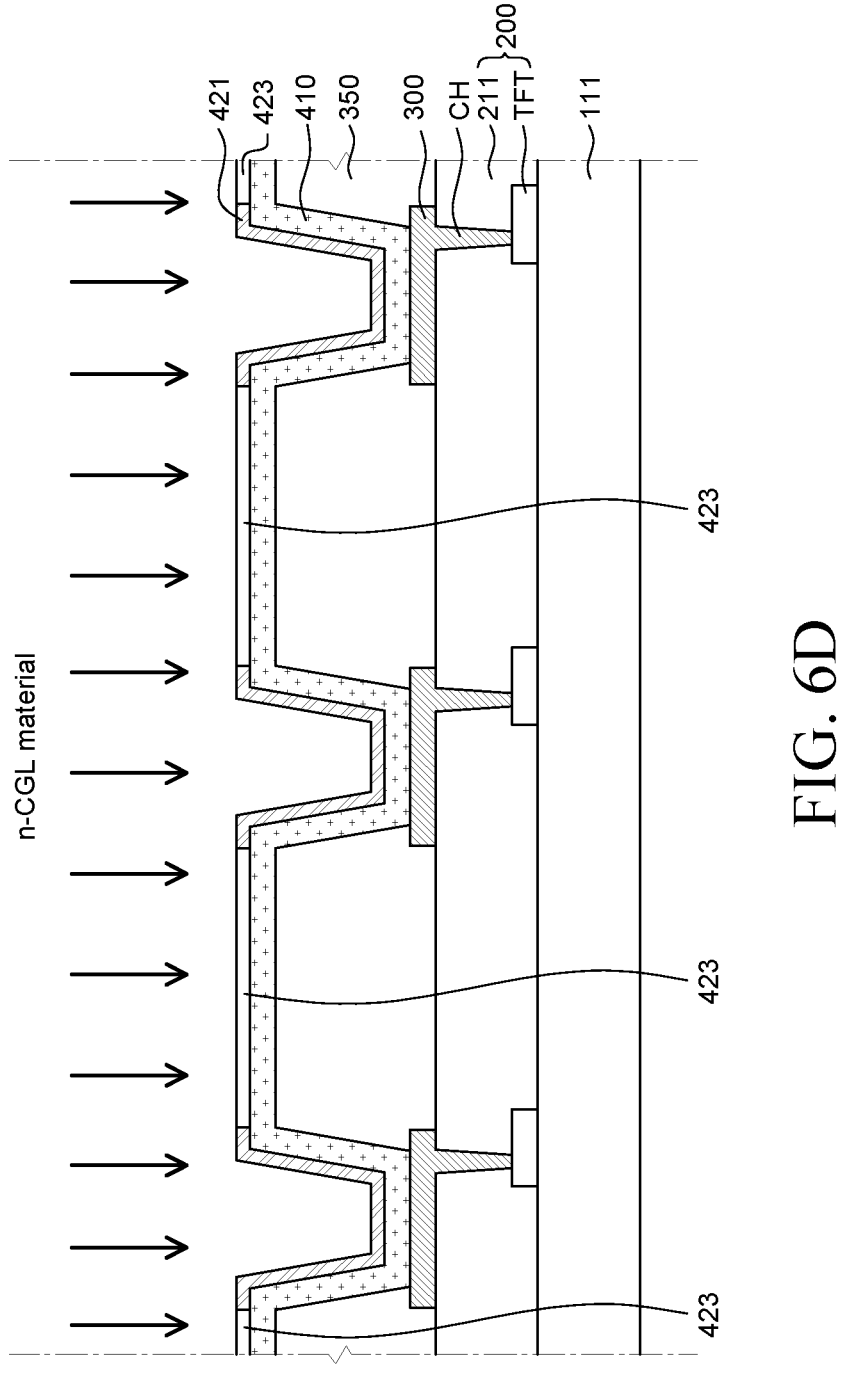

Next, as illustrated in FIG. 6D, the n-type charge generation material (n-CGL material) is deposited in accordance with a shape of the first emission unit 410 on the first substrate 111. At this time, the n-type charge generation material may be an alkali metal, an alkali metal compound, or an organic material or a compound thereof which serves to inject electrons. The film formation may be interrupted by a surface force difference of the path blocking layer 423 and the n-type charge generation material so that the n-type charge generation material may not be deposited on the path blocking layer 423. Accordingly, in the emitting area EA, the first charge generation layer 421 may be formed on the first emission unit 410 and in the non-emitting area NEA, the first charge generation layer 421 may not be formed on the path blocking layer 423.

Figure 6E:
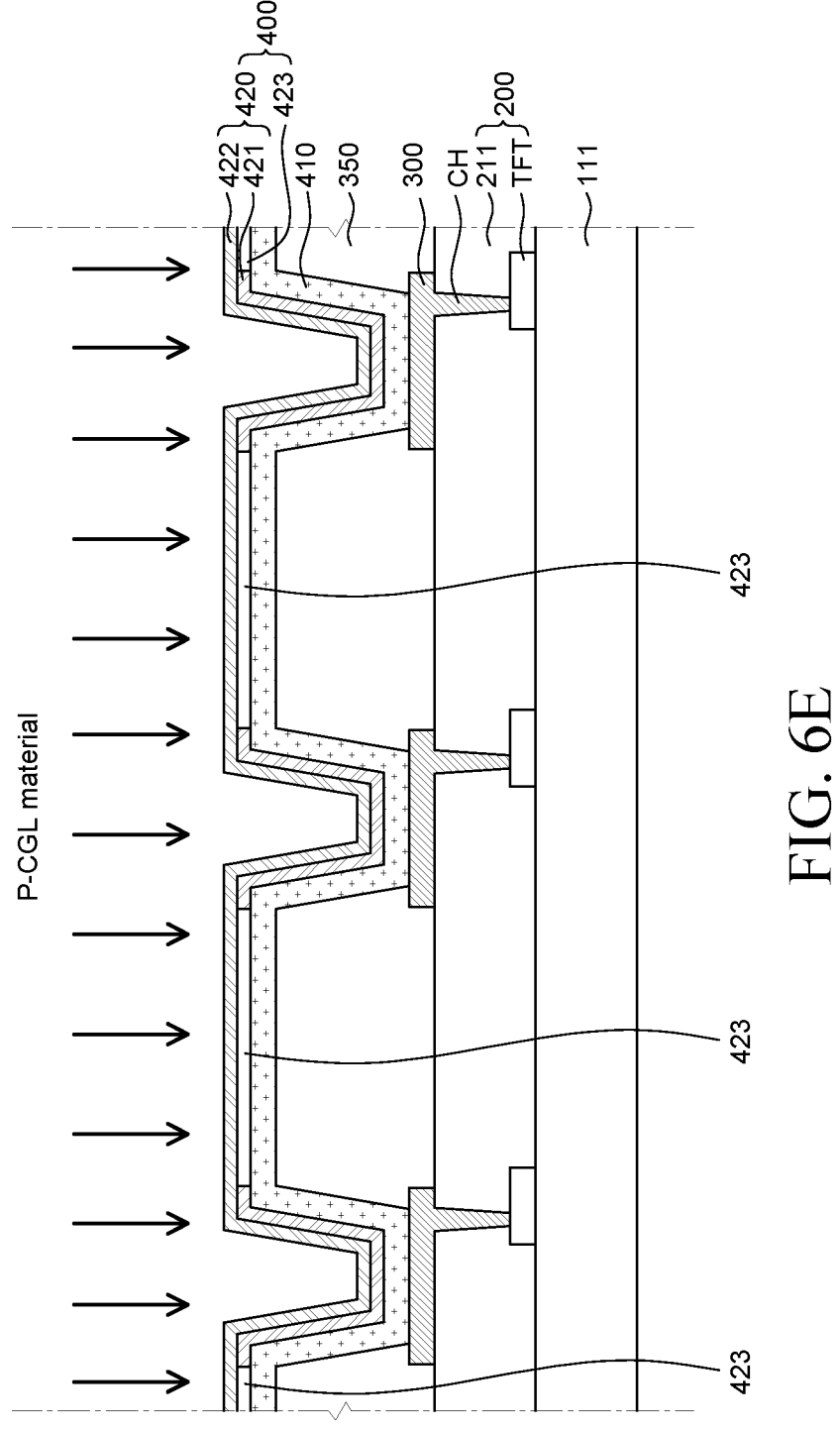

Next, as illustrated in FIG. 6E, the p-type charge generation material (p-CGL material) is deposited on the first charge generation layer 421 and the path blocking layer 423 on the first substrate 111 to form the second charge generation layer 422. Here, the p-type charge generating material is deposited using an open metal mask OMM in which the opening is formed in the entire display area and formed of a mixed layer in which an organic material such as 1, 4, 5, 8, 9, 11-hexaazatriphenylene-hexanitrile (HATCN), copper phthalocyanine (CuPc), and tris(4-bromophenyl)aluminum hexacholroantimonate (TBAHA) is doped with a p-type dopant.

Figure 6F:
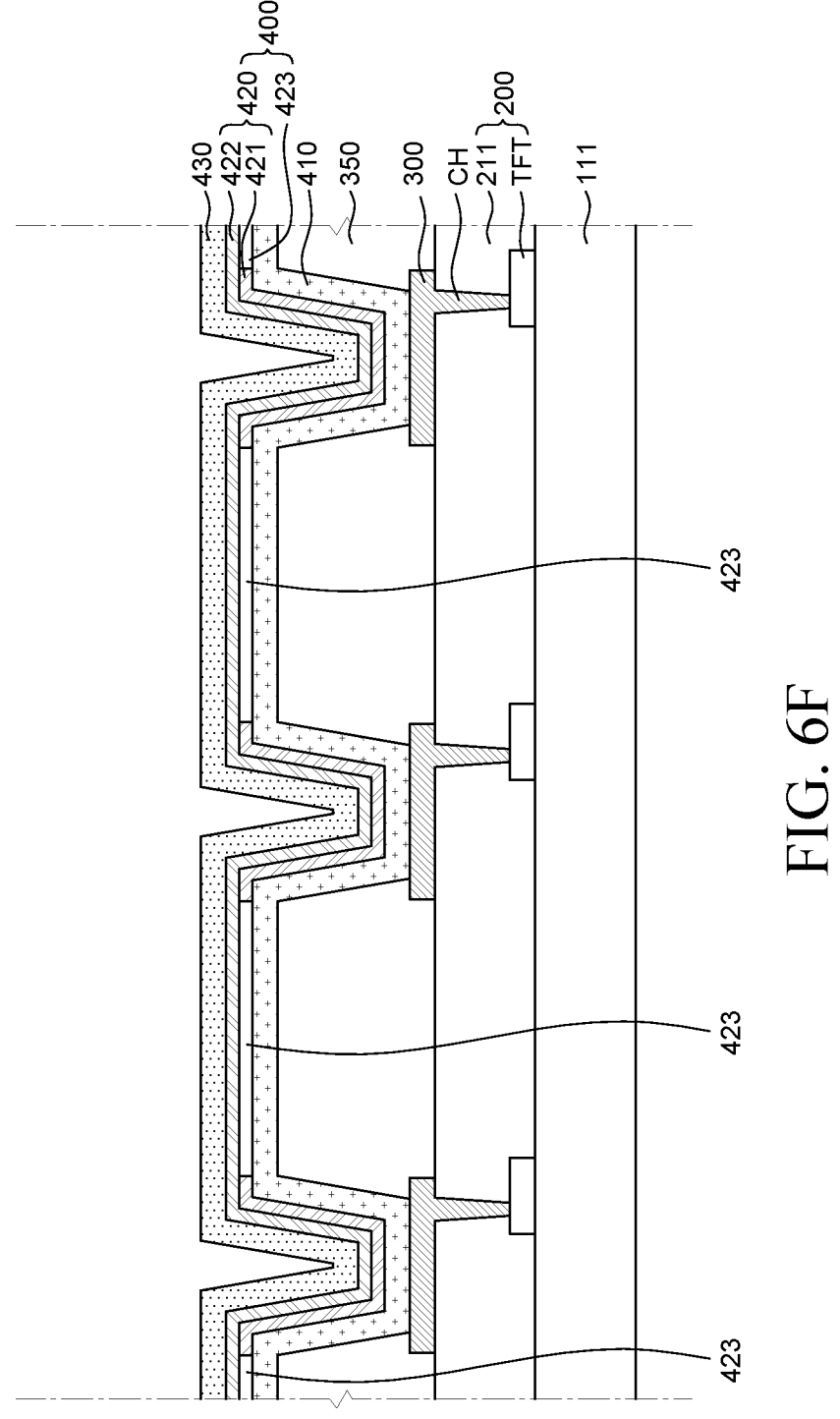

Next, as illustrated in FIG. 6F, when the second organic light emitting material (EL material) is deposited on the second charge generation layer 422 of the first substrate 111 to form the second emission unit 430 of the organic emission material layer 400, the organic emission material layer 400 of the organic light emitting display device 100 according to the exemplary embodiment of the present disclosure is formed.

Various organic light emitting diode structures for improving the efficiency and the lifespan of the organic light emitting diode and reducing power consumption are proposed to improve a quality and a productivity of the organic light emitting display device. Accordingly, an organic light emitting diode with a tandem structure which uses a plurality of stacks, that is, a lamination of a plurality of emission units has been proposed to implement the improved efficiency and lifespan characteristic, as well as an organic light emitting diode which applies one stack, that is, one emission unit.

In the organic light emitting diode with a tandem structure, that is, a two-stack structure using a lamination of a first emission unit and a second emission unit, an emitting area where light is emitted by recombination of the electrons and the holes is disposed in each of the first emission unit and the second emission unit. Therefore, the light emitted from a first organic emission material layer of the first emission unit and a second organic emission material layer of the second emission unit cause constructive interference to provide high luminance as compared with the organic light emitting diode with a single stack structure.

Further, the organic light emitting diode with the tandem structure has a charge generation layer CGL which supplies a positive charge and a negative charge, disposed between the first emission unit and the second emission unit.

With regard to this, the n-type charge generation layer which supplies negative charges, generally, includes an alkali metal such as lithium (Li), or an alkali metal compound. Such an N-type charge generation layer is deposited on the entire surface so that the metal material included in the n-type charge generation layer creates a path through which the leakage current flows. Therefore, not only a sub pixel which is required to emit light at the time of emitting mono color light at a low gray scale level, but also, an adjacent sub pixel which is not required to emit light emits light to cause a color mixture defect.

In order to solve the abnormal emission problem in that an unexpected adjacent sub pixel emits light due to the leakage current through the charge generation layer, there is a method for individually forming the n-type charge generation layer in the sub pixels using a fine metal mask. However, the n-type charge generation layer includes a metal material so that it is difficult to form the n-type charge generation layer using the fine metal mask.

Accordingly, the organic emission material layer 400 of the organic light emitting display device 100 according to the exemplary embodiment of the present disclosure is formed with a tandem structure. Further, in the charge generation unit 420 which supplies negative charges and positive charges to the first emission unit 410 and the second emission unit 430, in the non-emitting area NEA, the first charge generation layer 410 is not formed, but the path blocking layer 430 is formed. By doing this, a horizontal leakage current path is blocked to suppress the abnormal emission of an unexpected sub pixel SP.

FIG. 7 is a plan view illustrating another example of a pixel of FIG. 1 according to an exemplary embodiment of the present disclosure. Referring to FIG. 7, a pixel P' of an organic light emitting display device 700 according to another exemplary embodiment of the present disclosure, in the emitting area EA, a first sub pixel SP1, a second sub pixel SP2, and a third sub pixel SP3 are spaced apart from each other in parallel with a constant interval in a horizontal direction, that is, in an X-axis direction. In the meantime, in the non-emitting area NEA, a first path blocking layer 723-1 is disposed in the horizontal direction, that is, in the X-axis direction, at edges of the sub pixels SP, and a second path blocking layer 723-2 is disposed in the Y-axis direction which is a vertical direction, among edges of the sub pixels SP. That is, the pixel P' of the organic light emitting display device 700 according to another exemplary embodiment of the present disclosure may be disposed with a mesh structure to enclose edges of the sub pixels in the X-axis direction and the Y-axis direction.

As described above, in the pixel P' of the organic light emitting display device 700 according to another exemplary embodiment of the present disclosure, the path blocking layer 723 is disposed in the horizontal direction and the vertical direction to be adjacent to each sub pixel SP. Accordingly, the leakage current path flowing to a sub pixel SP adjacent to a sub pixel SP which emits light is blocked so that abnormal emission caused by a leakage current flowing into the adjacent sub pixel SP which is not expected to emit light may be suppressed.

FIG. 8 is a plan view illustrating still another example of a pixel of FIG. 1 according to an exemplary embodiment of the present disclosure. Referring to FIG. 8, a pixel P''' of an organic light emitting display device according to another exemplary embodiment of the present disclosure has a diamond pentile pixel arrangement structure in which red (R) sub pixels SP (e.g., R13, R21, R25), green (G) sub pixels (e.g., G12, G14, G22, and G24), blue (B) sub pixels SP (e.g., B11, B15, and B23) are disposed with a diamond pattern. Each sub pixel SP with a diamond pattern may include a side in a first direction and a side in a second direction intersecting the side in the first direction. Here, the first direction and the second direction may be different diagonal directions which are different from the X-axis direction and the Y-axis direction. As described above, a pentile pixel arrangement structure in which pixels P''' are disposed with a diamond pattern has an excellent perceptual image quality.

As described above, in the pixel P''' with a pentile pixel arrangement structure, in the non-emitting area NEA in which the gate line and the data line are disposed, a path blocking layer 823 is disposed to be adjacent to each sub pixel SP. The path blocking layer 823 may include a third path blocking layer 823-1 disposed in the first direction and a fourth path blocking layer 823-2 disposed in the second direction. Accordingly, the organic light emitting display device 800 having a pentile pixel arrangement structure according to another exemplary embodiment of the present disclosure suppresses mixed emission due to abnormal emission caused by a leakage current flowing to the adjacent pixel P''' to more clearly display an emitted color of the organic light emitting display device 800.

The exemplary embodiments of the present disclosure can also be described as follows:

According to an aspect of the present disclosure, there is provided an organic light emitting display device. The organic light emitting display device includes a substrate in which a first sub pixel emitting a first color, a second sub pixel emitting a second color, and a third sub pixel emitting a third color are disposed, a first electrode which defines emitting areas of the first sub pixel, the second sub pixel, and the third sub pixel and is disposed in the emitting area on the substrate, an organic light emitting diode on the first electrode, a bank which defines emitting areas of the first sub pixel, the second sub pixel, and the third sub pixel and is disposed in the non-emitting area to expose an upper portion of the first electrode and a second electrode on the organic light emitting diode. The organic light emitting diode includes a path blocking layer disposed in the non-emitting area.

The organic light emitting diode may include a first emission unit may be on the first electrode, a charge generation unit may be on the first emission unit and a second emission unit may be on the charge generation unit and the charge generation unit may include the path blocking layer.

The charge generation unit may include a first charge generation layer may be on the first emission unit in the emitting area, a path blocking layer may be on the first emission unit in the non-emitting area, a first charge generation layer may be disposed in the emitting area and a second charge generation layer may be on the path blocking layer disposed in the non-emitting area.

The first charge generation layer and the path blocking layer may be located at the same level.

The path blocking layer may be formed of an organic material layer formed of an organic material and the organic material may include at least one of carbon dioxide, diphenyldifluorosilane, anthracene, pyrene, and perfluoroethene.

The path blocking layer may include an organic material layer which may be disposed on the first emission unit in the non-emitting area and may be formed of an organic material and a metal particle layer which may be disposed above the organic material layer and may be formed of metal particles.

The metal particles may be the same material as a metal material included in a material which forms the first charge generation layer.

The first sub pixel, the second sub pixel, and the third sub pixel may be disposed on the substrate to be spaced apart from each other with a constant interval in a horizontal direction and the path blocking layer may be disposed with a stripe shape in a vertical direction in the non-emitting area between the sub pixels. That is to say that the path blocking layer may form or be arranged in stripes or parallel lines.

The first sub pixel, the second sub pixel, and the third sub pixel may be disposed on the substrate to be spaced apart from each other with a constant interval in a horizontal direction and the path blocking layer may include a first path blocking layer may be disposed in a vertical direction and a second path blocking layer may be disposed in a horizontal direction, among edges of the sub pixels in the non-emitting area.

The first sub pixel, the second sub pixel, and the third sub pixel may be disposed with a diamond pattern to have a diamond pentile shape or configuration and adjacent sub pixels may be disposed to be spaced apart from each other in a first direction and a second direction intersecting the first direction, and the path blocking layer may include a third path blocking layer disposed in the first direction and a fourth path blocking layer disposed in the second direction in the non-emitting area.

According to another aspect of the present disclosure, there is provided a manufacturing method of an organic light emitting display device. The manufacturing method of an organic light emitting display device forming a first electrode on a substrate on which a circuit element layer is formed, forming a bank on the first electrode to cover ends of the first electrode, forming a first emission unit by depositing a first organic light emitting material along the first electrode and an upper surface of the bank, depositing an organic material only above the bank to form a path blocking layer, depositing an n-type charge generation material above the first emission unit and the path blocking layer, detaching the n-type charge generation material deposited above the path blocking layer to form a first charge generation layer, depositing a p-type charge generating material above the first charge generation layer and the path blocking layer to form a second charge generation layer and forming a second emission unit by depositing a second organic light emitting material above the second charge generation layer.

The depositing of an n-type may be charge generation material, an open metal mask may be used.

The forming the path blocking layer by depositing an organic material, a fine metal mask may be used.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
a substrate on which a first sub pixel configured to emit a first color, a second sub pixel configured to emit a second color, and a third sub pixel configured to emit a third color are disposed;
a first electrode that defines emitting areas of the first sub pixel, the second sub pixel, and the third sub pixel, the first electrode on the substrate;
an organic light emitting diode on the first electrode;
a bank which defines the emitting areas of the first sub pixel, the second sub pixel, and the third sub pixel, the bank disposed in a non-emitting area and exposes an upper portion of the first electrode; and
a second electrode on the organic light emitting diode,
wherein the organic light emitting diode includes a path blocking layer in the non-emitting area,
wherein the path blocking layer comprises an organic material.

2. The organic light emitting display device according to claim 1, wherein the organic light emitting diode includes:
a first emission unit on the first electrode;
a charge generation unit on the first emission unit; and
a second emission unit on the charge generation unit, and
the charge generation unit includes the path blocking layer.

3. The organic light emitting display device according to claim 2, wherein the charge generation unit includes:
a first charge generation layer on the first emission unit in the emitting area, the first charge generation layer in the emitting area;
the path blocking layer on the first emission unit in the non-emitting area; and
a second charge generation layer on the path blocking layer in the non-emitting area.

4. The organic light emitting display device according to claim 3, wherein the first charge generation layer and the path blocking layer are located at a same level.

5. The organic light emitting display device according to claim 1, wherein the path blocking layer comprises an organic material layer and the organic material layer includes at least one of carbon dioxide, diphenyldifluorosilane, anthracene, pyrene, and perfluoroethene.

6. The organic light emitting display device according to claim 2, wherein the path blocking layer includes:
an organic material layer on the first emission unit in the non-emitting area; and
a metal particle layer that is above the organic material layer, the metal particle layer including metal particles.

7. The organic light emitting display device according to claim 6, wherein the metal particles are a same material as a metal material included in a material which forms the first charge generation layer.

8. The organic light emitting display device according to claim 1, wherein the first sub pixel, the second sub pixel, and the third sub pixel are spaced apart from each other with a constant interval in a horizontal direction and the path blocking layer is disposed with a stripe shape in a vertical direction in the non-emitting area between the sub pixels.

9. The organic light emitting display device according to claim 1, wherein the first sub pixel, the second sub pixel, and the third sub pixel are spaced apart from each other with a constant interval in a horizontal direction and the path blocking layer includes a first path blocking layer disposed in a vertical direction and a second path blocking layer disposed in a horizontal direction, among edges of the sub pixels in the non-emitting area.

10. The organic light emitting display device according to claim 1, wherein the first sub pixel, the second sub pixel, and the third sub pixel are disposed in a diamond pattern so as to have a diamond pentile shape and adjacent sub pixels are spaced apart from each other in a first direction and a second direction intersecting the first direction, and the path blocking layer includes a third path blocking layer disposed in the first direction and a fourth path blocking layer disposed in the second direction in the non-emitting area.

* * * * *